(12) United States Patent
De et al.

(10) Patent No.: US 8,479,128 B2
(45) Date of Patent: Jul. 2, 2013

(54) TECHNIQUE FOR HONORING MULTI-CYCLE PATH SEMANTICS IN RTL SIMULATION

(75) Inventors: Kaushik De, Bangalore (IN); Badri P. Gopalan, Santa Clara, CA (US); Dhiraj Goswami, Wilsonville, OR (US)

(73) Assignee: Synopsys, Inc., Mountain View, CA (US)

( * ) Notice: Subject to any disclaimer, the term of this patent is extended or adjusted under 35 U.S.C. 154(b) by 191 days.

(21) Appl. No.: 13/039,982

(22) Filed: Mar. 3, 2011

(65) Prior Publication Data

US 2012/0227022 A1    Sep. 6, 2012

(51) Int. Cl.
*G06F 17/50*    (2006.01)
(52) U.S. Cl.
USPC ............................ 716/106; 716/132; 716/136
(58) Field of Classification Search
None
See application file for complete search history.

(56) References Cited

U.S. PATENT DOCUMENTS

| | | | |
|---|---|---|---|
| 6,336,087 B2 * | 1/2002 | Burgun et al. | 703/15 |
| 6,993,733 B2 * | 1/2006 | Murphy | 716/106 |
| 7,607,118 B1 * | 10/2009 | Hutton | 716/108 |
| 7,913,204 B2 * | 3/2011 | Masuda | 716/104 |
| 8,185,854 B1 * | 5/2012 | Hutton et al. | 716/108 |
| 2001/0011212 A1 | 8/2001 | Raynaud et al. | |
| 2003/0192023 A1 | 10/2003 | Murphy | |
| 2009/0164967 A1 | 6/2009 | Masuda | |

\* cited by examiner

*Primary Examiner* — Leigh Garbowski
(74) *Attorney, Agent, or Firm* — Bever, Hoffman & Harms, LLP; Jeanette S. Harms

(57) ABSTRACT

An enhanced RTL simulation including information regarding multi-cycle paths is provided. The multi-cycle path information, which is available in the design constraint file, can be used for timing analysis during RTL simulation. This information can advantageously augment the RTL simulation engine to approximate the cycle delays at the destination registers, thereby providing a more realistic approximation of circuit behavior at the RTL level. Notably, RTL simulation is orders of magnitude faster than gate level simulation. Moreover, design bugs associated with multi-cycle paths are more easily corrected during RTL simulation compared to waiting until the gate level simulation.

21 Claims, 7 Drawing Sheets

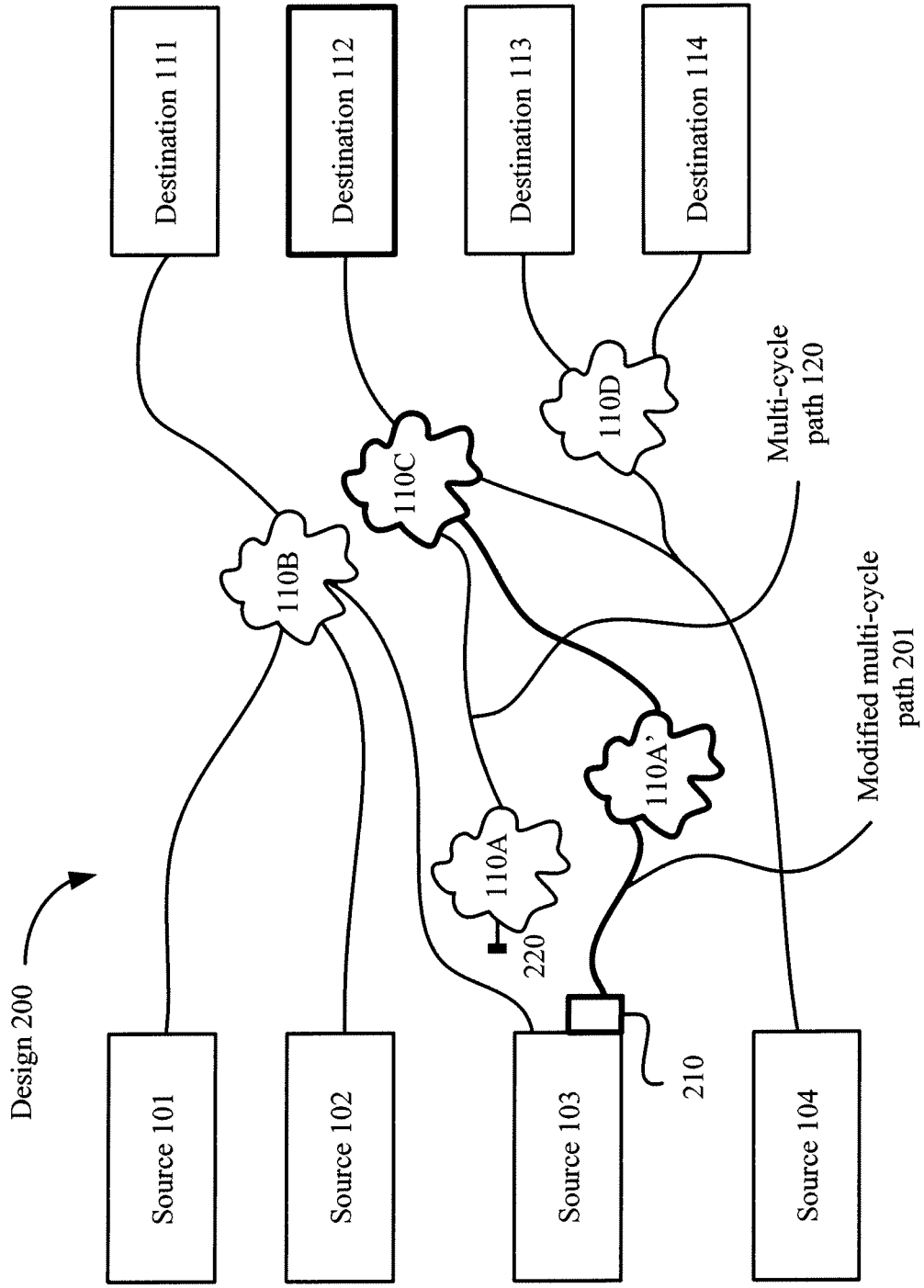

TECHNIQUE FOR HONORING MULTI-CYCLE PATH SEMANTICS IN RTL SIMULATION

BACKGROUND OF THE INVENTION

1. Field of the Invention

The present invention relates to register transfer level (RTL) simulation, and in particular to a technique of incorporating multi-cycle path information during RTL simulation.

2. Related Art

Some combinational paths of an integrated circuit (IC) design are multi-cycle, i.e. the transition from the source is not supposed to reach the destination in one cycle. In general, multi-cycle paths are due to implementation constraints, e.g. user directives to a tool indicating specific delays for specific paths in the design. In other words, the user may indicate that a specific source may take up to a set number of cycles (e.g. 2, 3, or 4 cycles) to send its value to a specific destination via a specific path. The number of delay cycles set by the user may be due to the type of and/or amount of intervening combinational logic present in the path.

These multi-cycle paths are provided in sideband files as design constraint commands to the synthesis tool, which generates a gate/netlist level description, and the timing analysis tool for use during timing analysis to verify timing constraints. Note that the code input to the synthesis and timing analysis tool merely provides the combinational logic transfer function between the source and destination for the path connecting that source/destination. However, when synthesis and timing analysis is being performed, the synthesis and timing tool will access the sideband file(s) to ensure that design constraint commands are taken into account.

However, during register transfer level (RTL) simulation (which accesses an RTL description and verifies correct system operation), this information is not used. Specifically, in RTL, all combinational paths are characterized as zero delay, i.e. single cycle. Therefore, the transition on a multi-cycle path reaches the destination in one cycle. Unfortunately, this early transition can lead to incorrect simulation results and can mask design bugs. For example, any design flaw that expects a multi-cycle path to propagate a transition in one cycle will erroneously pass RTL simulation.

These multi-cycle path bugs may be caught later during gate level simulation with detailed timing annotated to the gates. However, this analysis is very late in the design cycle and generally involves expensive iterations of verification, synthesis, and place & route in addition to being very performance intensive and slow. Thus, gate level simulation is commercially impractical to cover more than a handful of multi-cycle path bugs. In the worst case, the multi-cycle path bugs may not be detected until tape out, thereby causing a re-spin of one or more masks.

SUMMARY OF THE INVENTION

A method for enhancing register transfer level (RTL) simulation is described. In this method, an RTL file and a sideband file for the design can be accessed. The RTL file describes the paths of the design including the sources and destinations of those paths. The sources and destinations can include flip-flops or other state devices of the design.

Then, the design constraints of the sideband file can be identified. These design constraints include multi-cycle paths. Using a computer, the design can be modified by duplicating portions of the multi-cycle paths to create duplicated multi-cycle paths, inserting delays in the duplicated multi-cycle paths, and cutting the original multi-cycle paths from their sources. At this point, the modified design, which includes the multi-cycle path information, can be simulated.

Duplicating portions of the multi-cycle paths can include duplicating and combinational logic of the multi-cycle paths. In one embodiment, at least the combinational logic connected to the sources of the multi-cycle path can be duplicated. In another embodiment, all of the combinational logic of the multi-cycle path is duplicated. In yet another embodiment, the duplicated combinational logic can be minimized to ensure that an inserted delay for each multi-cycle path affects only that multi-cycle path.

The inserted delays can be controllable. In one embodiment, the delays may be selectable by a user. Each delay can be within a range specified by a user or less than a maximum delay specified by the user. Each delay can be used for one or more RTL simulations. In one embodiment, the modification of the design can be made dependent on the value of multi-cycle.

A computer-readable medium storing computer-executable instructions for enhancing register transfer level (RTL) simulation is also described. These instructions when executed by a computer can perform the steps described above. A system for enhancing register transfer level (RTL) simulation is also described. This system can include a processor configured to perform the steps described above.

BRIEF DESCRIPTION OF THE DRAWINGS

FIG. 2A illustrates the design of FIG. 1B with a duplicated portion of the multi-cycle path and its associated delay.

DETAILED DESCRIPTION OF THE DRAWINGS

In accordance with one aspect of an improved RTL simulation, the information regarding multi-cycle paths can be accessible and used. Specifically, the multi-cycle path information, which is available in a design constraint file, can be accessed and used for timing analysis during RTL simulation. This information can advantageously augment the RTL simulation engine to approximate the cycle delays at the destination registers, thereby providing a more realistic approximation of circuit behavior at the RTL level. Notably, RTL simulation is orders of magnitude faster than gate level simulation. Moreover, design bugs associated with multi-cycle paths are more easily corrected during RTL simulation compared to waiting until the gate level simulation. Therefore, enhancing RTL simulation with multi-cycle path information can provide significant improvements in verification confidence compared to conventional RTL simulation.

Figure 1A:
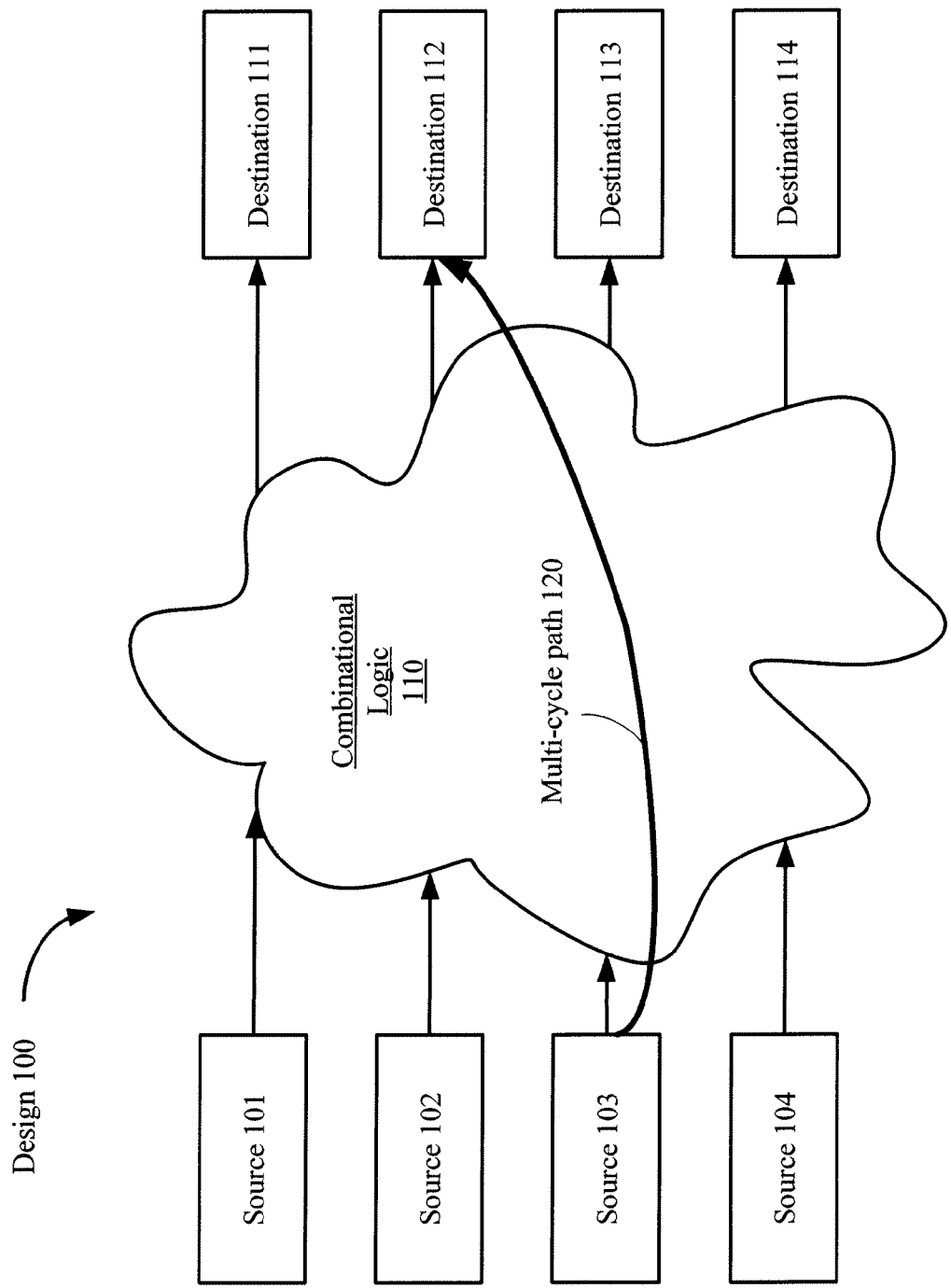
FIG. 1A illustrates a design including a plurality of sources and destinations with intervening combination logic. In this design, one multi-cycle path has been designated.

FIG. 1A illustrates a simplified design 100 including a plurality of sources 101-104, a plurality of multiple destinations 111-114, and intervening combination logic 110. Note that sources and destinations can be implemented with state devices, such as flip-flops or other registers. Further note that sources and destinations may have other than a one-to-one correspondence. For example, source 101 may have two destinations 113 and 114. In other embodiments, multiple sources may have a same destination, e.g. sources 103 and 104 may have a single destination 111.

Notably, in typical designs, multi-cycle paths are intermixed with single-cycle paths. For example, in FIG. 1A, a multi-cycle path 120 is designated between source 103 and destination 112. Other paths between sources 101-104 and destinations 111-114 (not shown for simplicity) are conventional, single-cycle paths.

In accordance with enhanced RTL simulation, a sideband file (e.g. the design constraint file typically used during gate level simulation) can indicate that any transition from source 103 associated with multi-cycle path 120 will reach destination 112 after N clock cycles (wherein N is a positive integer set by a user). This delayed value change will be merged into any logic cone (i.e. taking into account multiple sources, if present) that drives destination 112. Note that for all other sources that drive destination 112, the transitions of those other sources should reach destination 112 in a single cycle. In the configuration shown in FIG. 1A, destinations 111, 113, and 114 are associated with single cycle paths and therefore are driven by current values. As described in further detail below, only values from source 103 to destination 112, i.e. the designated multi-cycle path 120, should be delayed.

Figure 1B:
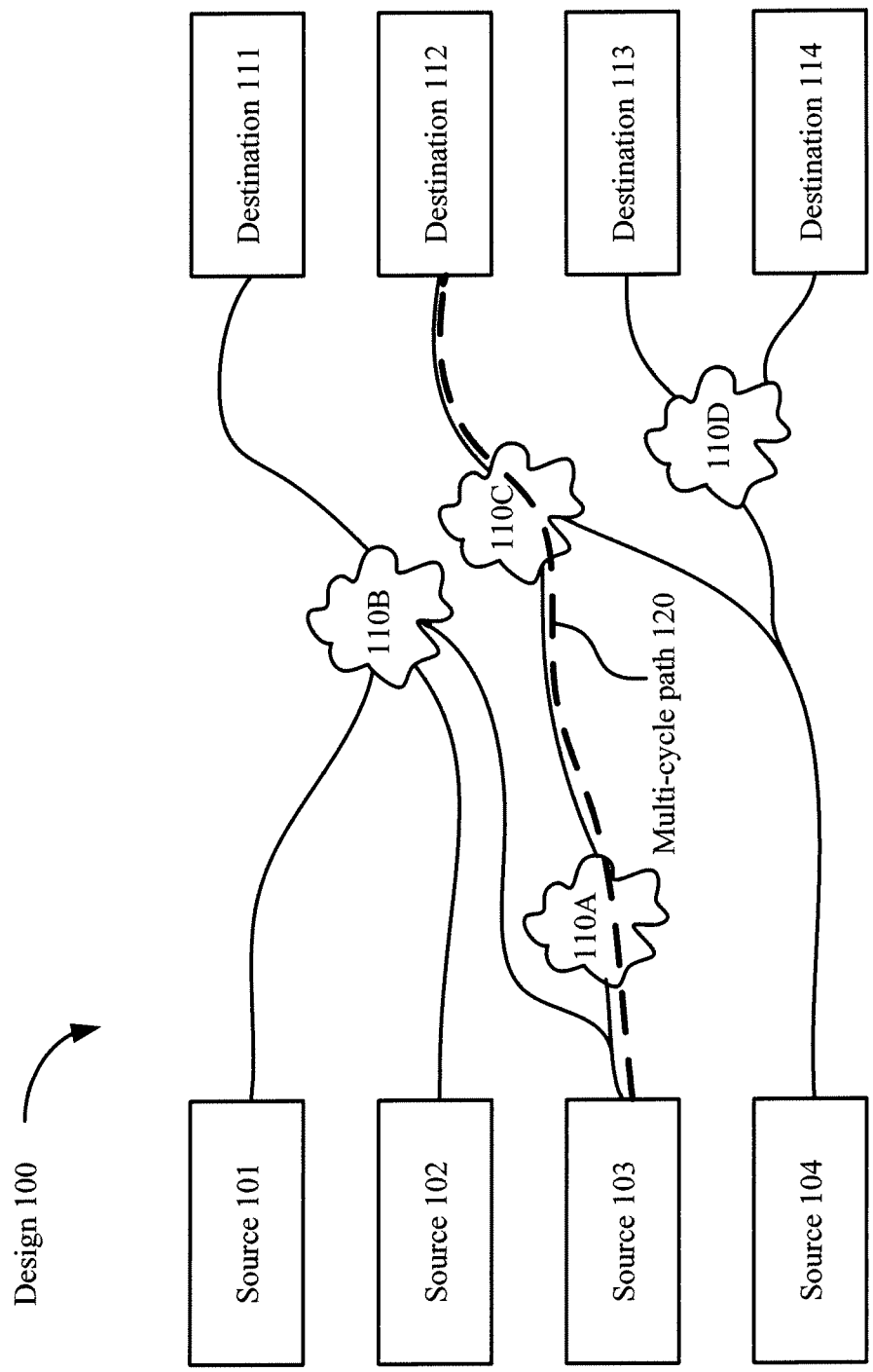
FIG. 1B illustrates various single-cycle paths that may be present in the design of FIG. 1A with the designated multi-cycle path.

FIG. 1B illustrates various single-cycle paths that may be present in design 100 with multi-cycle path 120. Note that combinational logic 110 (FIG. 1A) includes combinational logic 110A, 110B, 110C, and 110D. In design 100, sources 101, 102, and 103 have single-cycle paths to destination 111 through combinational logic 110B. Source 104 has single-cycle paths to destinations 113 and 114 through combinational logic 110D and a single-cycle path to destination 112 through combinational logic 110C.

Figure 1C:
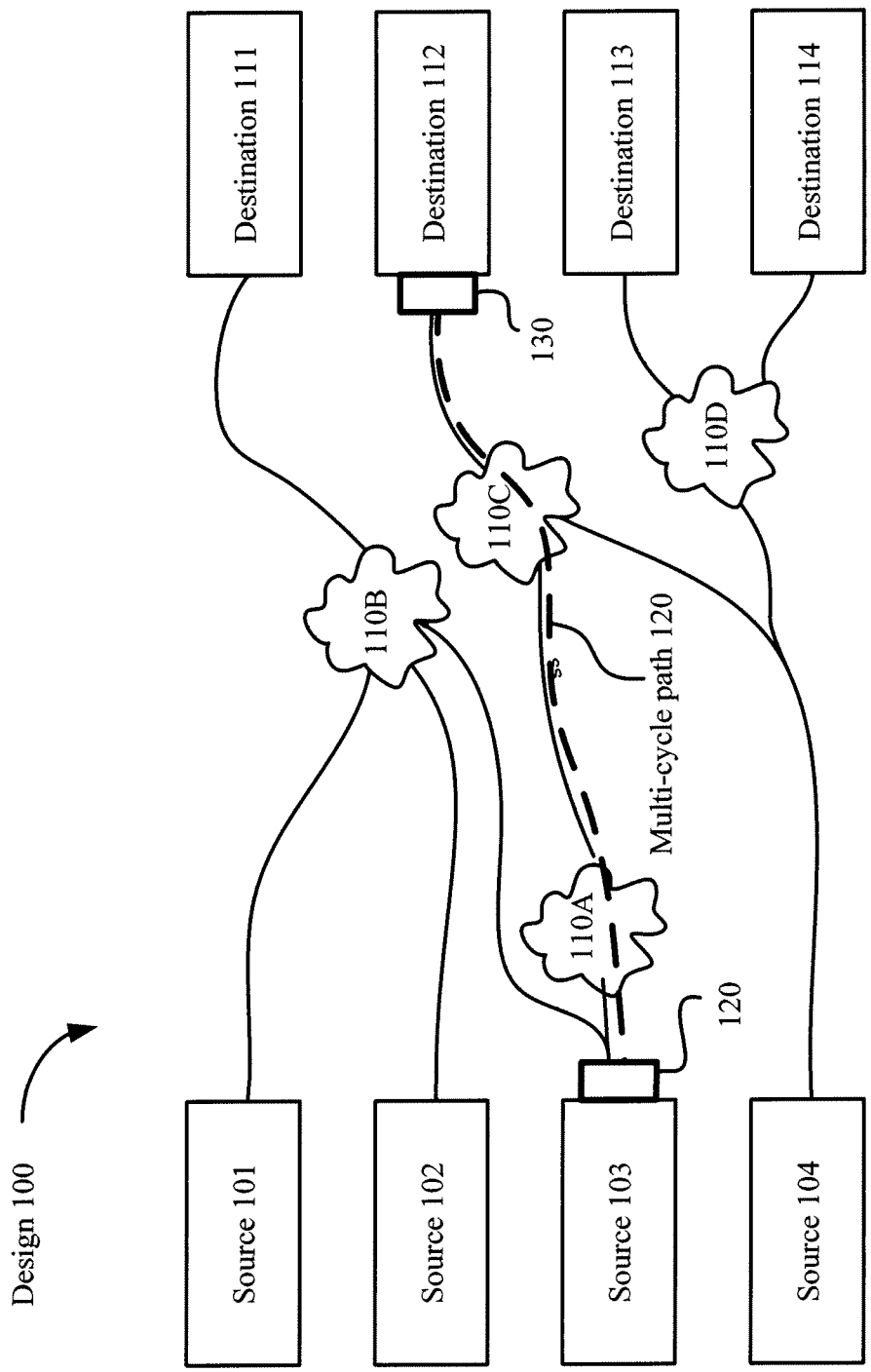
FIG. 1C shows the design of FIG. 1B with placed delays that can result in erroneous analysis.

Notably, the RTL simulation tool does not have actual circuit implementation and timing details. Thus, the RTL tool cannot distribute a delay along a multi-cycle path. However, merely placing delays at the inputs or outputs of the multi-cycle paths could result in erroneous analysis. For example, FIG. 1C illustrates a delay 120 placed at the input of multi-cycle path 120. Unfortunately, although delay 120 provides the appropriate delay for multi-cycle path 120, it provides erroneous information to the path between source 103 and destination 111. Similarly, a delay 130 placed at the output of multi-cycle path 120 provides erroneous information to the path between source 104 and destination 112.

Therefore, to ensure that the delay associated with a multi-cycle path does not disturb any other path, an enhanced RTL simulation tool can duplicate portions of the multi-cycle paths and disconnect/cut the original multi-cycle paths from their sources in the original design. For example, FIG. 2A illustrates design 200, which duplicates a portion of multi-cycle path 120 to create a modified multi-cycle path 201. In this embodiment, the RTL tool can duplicate the portion of multi-cycle path 120 including combinational logic 110, thereby creating new combinational logic 110A'. In this configuration, multi-cycle path 201 connects source 103 to destination 112 via combinational logic 110A' and 110C', and delay 210 can be placed at the input of multi-cycle path 201. Notably, delay 210 will not affect any other path in design 200. At this point, multi-cycle path 120 can be cut at its original source, i.e. at node 220, thereby allowing the RTL tool to effectively ignore its contribution to design 200. Note that this cutting also does not affect any other path in design 200.

Figure 2B:
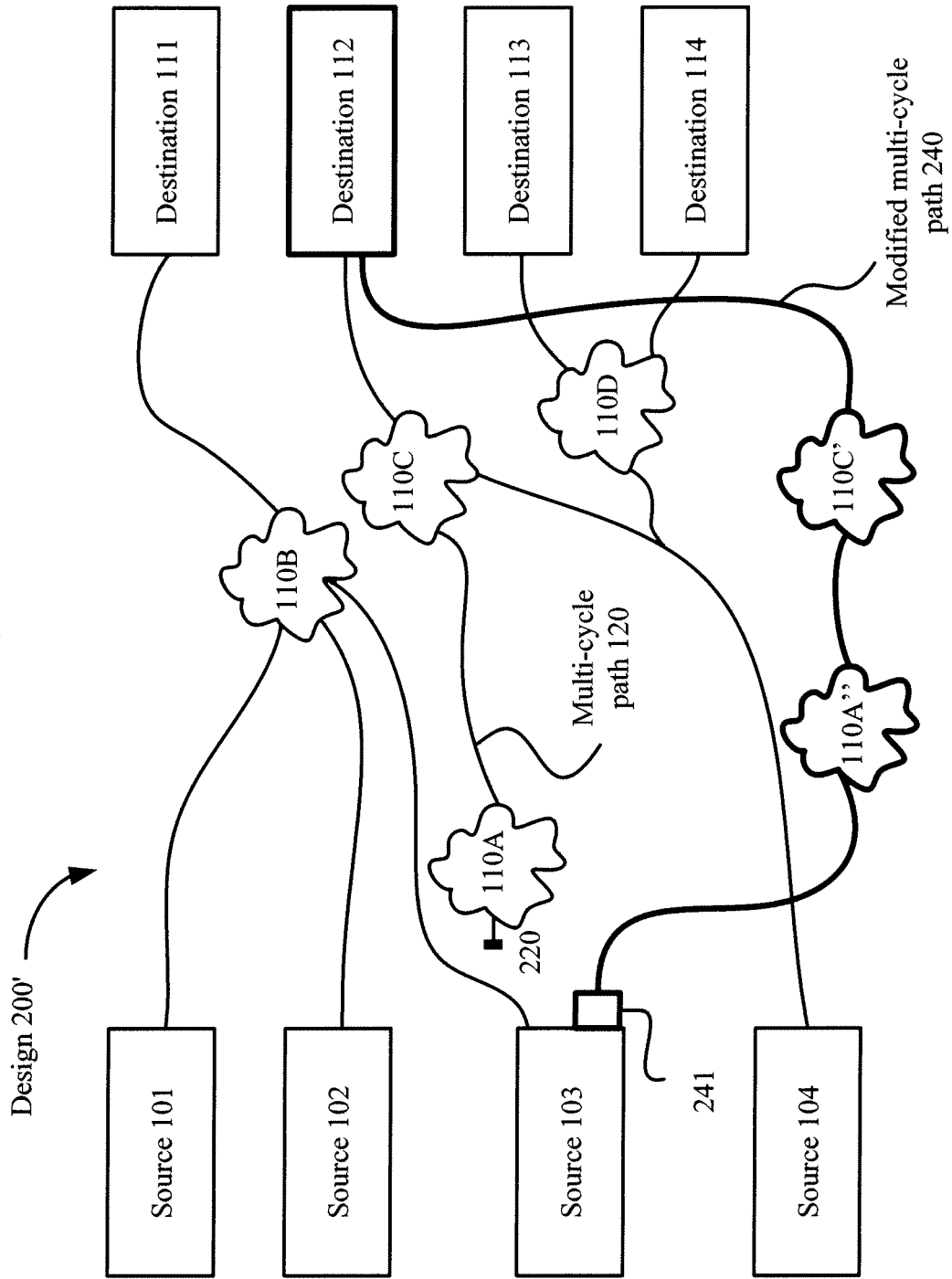
FIG. 2B illustrates the design of FIG. 1B with another duplicated portion of the multi-cycle path and its associated delay.

In another embodiment, multi-cycle path 120 can be duplicated in its entirety (with the exception of the source and destination), as shown in design 200' of FIG. 2B. In this embodiment, a modified multi-cycle path 240 includes new combinational logic 110A" and new combinational logic 110C'. In this configuration, modified multi-cycle path 240 connects source 103 to destination 112 via combinational logic 110A" and 110C', and a delay 241 can be placed at the input of multi-cycle path 240. Notably, delay 241 will not affect any other path in design 200'. Once again, multi-cycle path 120 can be cut at its input, i.e. at node 220, thereby allowing the RTL tool to effectively ignore its contribution to design 200'.

In one embodiment, the actual portions of the multi-cycle paths that are duplicated can be based on the specific logic fan-ins and fan-outs present in the design. Specifically, the portion of each multi-cycle path that is duplicated can be determined by the minimal amount of duplicated combinational logic that ensures no other paths are affected in the design. In this embodiment, the RTL tool would first create design 200 (FIG. 2A) and determine whether any other paths are affected. If not, then the RTL tool can save multi-cycle path 201 in a modified design file for use during RTL simulation. If so, then the RTL tool could duplicate more combinational logic to create design 200' (FIG. 2B). This process is repeated until the duplicated combinational logic results in a multi-cycle path that does not affect any other path in the design. In this embodiment, for the configuration shown in FIG. 2A, the RTL tool would save multi-cycle path 201 and not proceed to the configuration shown in FIG. 2B.

Note that design 200 (FIG. 2A) and design 200' (FIG. 2B) are identical in function to design 100 (FIG. 1B). That is,
Destination 111=f (Source 101, Source 102, Source 103)
Destination 112=f (Source 103, Source 104)
Destination 113=f (Source 104)
Destination 114=f (Source 104)

Indeed, the duplicated portions of the multi-cycle paths do not create actual new paths in the fabricated IC. In other words, the duplicated portions of the multi-cycle paths are merely for use by the RTL tool during RTL simulation.

Figure 3:
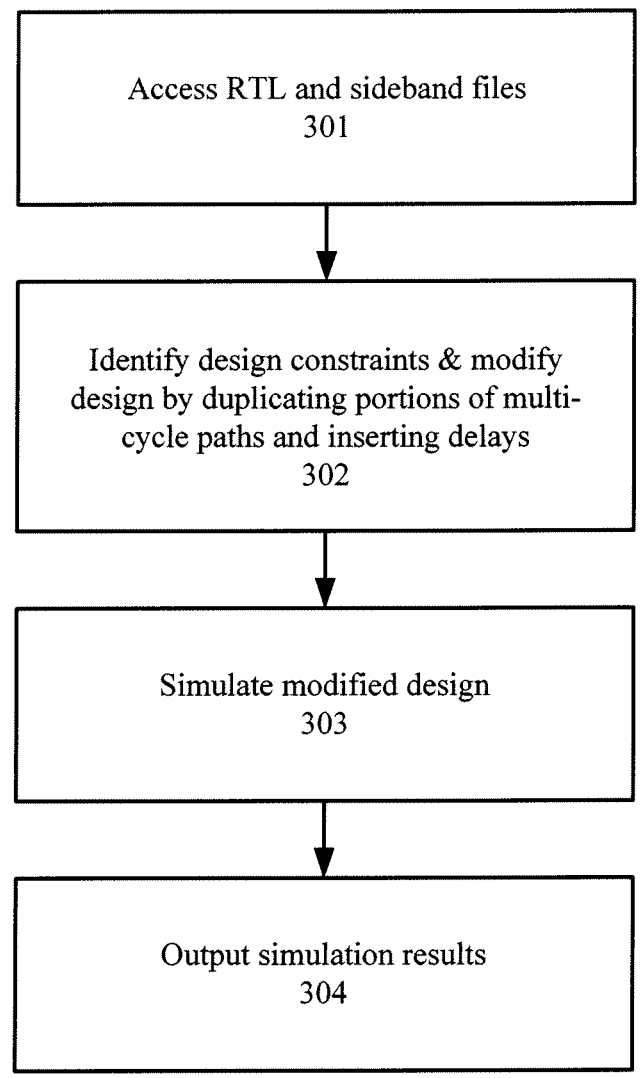
FIG. 3 illustrates a technique for providing an enhanced RTL simulation.

FIG. 3 illustrates an exemplary technique for providing an enhanced RTL simulation. In step 301, the RTL tool accesses a user RTL file (which indicates all paths in the design, including sources and destinations) and a sideband file (which includes one or more design constraints). In step 302, the RTL tool identifies the design constraints and modifies the design provided in the RTL file. This modification includes generating duplicated portions of the multi-cycle paths (which were identified as design constraints in the sideband file) and inserting delays at the inputs of the modified multi-cycle paths. As described above, the duplication of portions of the multi-cycle paths can include the combinational logic of the paths. The original multi-cycle paths can be cut from their sources. In step 303, the RTL tool simulates the modified design to generate accurate timing results at the RTL level. Step 304 can output these timing results.

Notably, the inserted delays can now be fully controllable. That is, referring back to FIG. 2A, the user can easily specify delay 210 as having multiple delays, wherein a first simulation can use a first delay 210, a second simulation can use a second delay 210, etc. In one embodiment, the RTL tool can use a maximum delay value specified by the user for one simulation and then automatically perform additional simulations using one or more delay values less than the maximum specified delay. In another embodiment, the RTL tool can use one or more delay values within a range of delay values specified by the user. As noted above, the delays can be used in one or more RTL simulations.

A typical design has a limited number of multi-cycle paths, e.g. typically less than 1% of the total number of paths. Therefore, the simulation of duplicated portions of such multi-cycle paths has very little overhead while allowing the RTL tool to take into account multi-cycle information for specific multi-cycle paths without affecting any other paths in the design.

Figure 4:
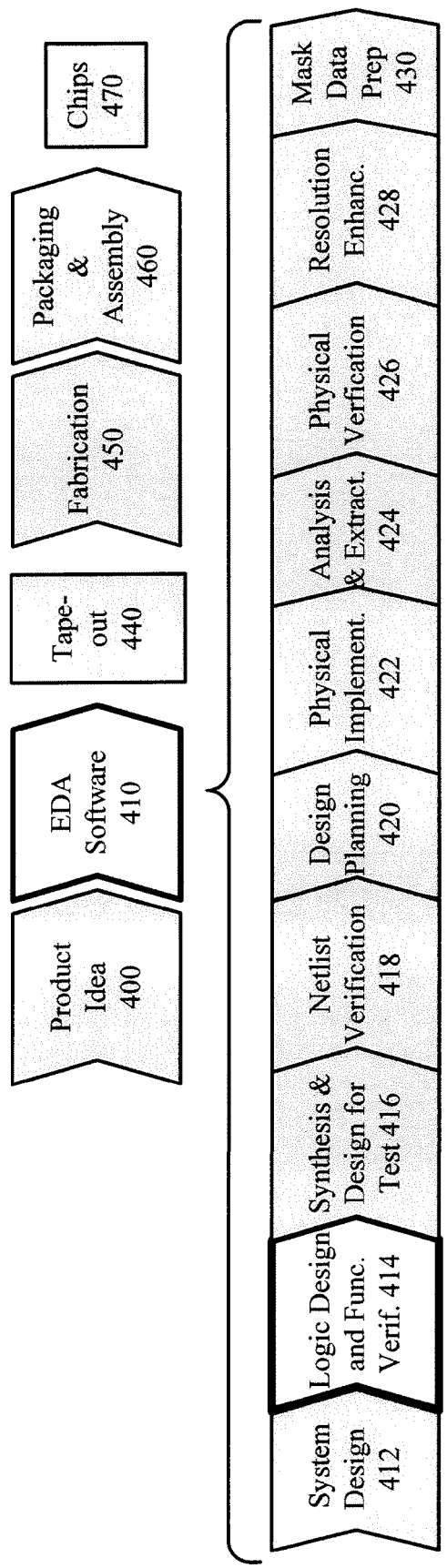
FIG. 4 illustrates a simplified representation of an exemplary digital ASIC design flow.

FIG. 4 shows a simplified representation of an exemplary digital ASIC design flow that can include RTL simulation with multi-cycle path information. At a high level, the process starts with the product idea (step 400) and is realized in an EDA software design process (step 410). When the design is finalized, it can be taped-out (event 440). After tape out, the fabrication process (step 450) and packaging and assembly processes (step 460) occur resulting, ultimately, in finished chips (result 470).

The EDA software design process (step 410) is actually composed of a number of steps 412-430, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 410) will now be provided. System design (step 412): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 414): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products. In one embodiment, the enhanced RTL simulation using multi-cycle path information can be performed in step 414.

Synthesis and design for test (step 416): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, DFTMAX, TetraMAX, and DesignWare® products.

Netlist verification (step 418): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 420): Here, an overall floorplan for the chip is constructed and analyzed for timing and top-level routing. Exemplary EDA software products from Synopsys, Inc. that can be used at this step include Astro and IC Compiler products.

Physical implementation (step 422): The placement (positioning of circuit elements) and routing (connection of the same) occurs at this step. Exemplary EDA software products from Synopsys, Inc. that can be used at this step include the Astro and IC Compiler products.

Analysis and extraction (step 424): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 426): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 428): This step involves geometric manipulations of the layout to improve manufacturability of the design. Exemplary EDA software products from Synopsys, Inc. that can be used at this step include Proteus, ProteusAF, and PSMGen products.

Mask data preparation (step 430): This step provides the "tape-out" data for production of masks for lithographic use to produce finished chips. Exemplary EDA software products from Synopsys, Inc. that can be used at this step include the CATS(R) family of products.

RTL simulation with multi-cycle path information can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

The embodiments described herein are not intended to be exhaustive or to limit the invention to the precise forms disclosed. As such, many modifications and variations will be apparent. Accordingly, it is intended that the scope of the invention be defined by the following Claims and their equivalents.

The invention claimed is:
1. A method for enhancing register transfer level (RTL) simulation, the method comprising:
    accessing an RTL file and a sideband file for a design;
    identifying design constraints in the sideband file, the design constraints including multi-cycle paths;
    using a computer, modifying the design by duplicating portions of the multi-cycle paths to create modified multi-cycle paths, inserting delays in the modified multi-cycle paths, and cutting the multi-cycle paths from their sources; and simulating the modified design during the RTL simulation.

2. The method of claim 1, wherein the duplicating portions of the multi-cycle paths includes duplicating certain combinational logic of the multi-cycle paths.

3. The method of claim 2, wherein the duplicating portions of the multi-cycle paths includes duplicating all combinational logic of the multi-cycle paths.

4. The method of claim 2, wherein the delays are controllable.

5. The method of claim 2, wherein the delays are selectable by a user.

6. The method of claim 2, wherein each delay is within a range specified by a user, and is usable for one or more RTL simulations.

7. The method of claim 2, wherein each delay is less than a maximum delay specified by a user, and is usable for one or more RTL simulations.

8. A computer-readable medium storing computer-executable instructions for enhancing register transfer level (RTL) simulation, which when executed by a computer performs steps comprising:

accessing an RTL file and a sideband file for a design;

identifying design constraints in the sideband file, the design constraints including multi-cycle paths;

modifying the design by duplicating portions of the multi-cycle paths to create modified multi-cycle paths, inserting delays in the modified multi-cycle paths, and cutting the multi-cycle paths from their sources; and simulating the modified design during the RTL simulation.

9. The computer-readable medium of claim 8, wherein the duplicating portions of the multi-cycle paths includes duplicating certain combinational logic of the multi-cycle paths.

10. The computer-readable medium of claim 9, wherein the duplicating portions of the multi-cycle paths includes duplicating all combinational logic of the multi-cycle paths.

11. The computer-readable medium of claim 9, wherein the delays are controllable.

12. The computer-readable medium of claim 9, wherein the delays are selectable by a user.

13. The computer-readable medium of claim 9, wherein each delay is within a range specified by a user, and is usable for one or more RTL simulations.

14. The computer-readable medium of claim 9, wherein each delay is less than a maximum delay specified by a user, and is usable for one or more RTL simulations.

15. A system for enhancing register transfer level (RTL) simulation, the system including a processor configured to perform steps comprising:

accessing an RTL file and a sideband file for a design;

identifying design constraints in the sideband file, the design constraints including multi-cycle paths;

using a computer, modifying the design by duplicating portions of the multi-cycle paths to create modified multi-cycle paths, inserting delays in the modified multi-cycle paths, and cutting the multi-cycle paths from their sources; and simulating the modified design during the RTL simulation.

16. The system of claim 15, wherein the duplicating portions of the multi-cycle paths includes duplicating certain combinational logic of the multi-cycle paths.

17. The system of claim 16, wherein the duplicating portions of the multi-cycle paths includes duplicating all combinational logic of the multi-cycle paths.

18. The system of claim 16, wherein the delays are controllable.

19. The system of claim 16, wherein the delays are selectable by a user.

20. The system of claim 16, wherein each delay is within a range specified by a user, and is usable for one or more RTL simulations.

21. The system of claim 16, wherein each delay is less than a maximum delay specified by a user, and is usable for one or more RTL simulations.

* * * * *